United States Patent
Adetutu et al.

(10) Patent No.: US 6,881,681 B2
(45) Date of Patent: Apr. 19, 2005

(54) FILM DEPOSITION ON A SEMICONDUCTOR WAFER

(75) Inventors: Olubunmi O. Adetutu, Austin, TX (US); Marc Rossow, Austin, TX (US); Anna M. Phillips, Manchaca, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 10/301,993

(22) Filed: Nov. 22, 2002

(65) Prior Publication Data

US 2004/0102040 A1 May 27, 2004

(51) Int. Cl.[7] .................................................. H01L 21/31
(52) U.S. Cl. ...................... 438/758; 438/778; 438/762; 438/788
(58) Field of Search .................................. 438/758, 761, 438/778, 782, 788, 791

(56) References Cited

U.S. PATENT DOCUMENTS

| | | | |
|---|---|---|---|
| 6,136,678 | A | 10/2000 | Adetutu et al. |
| 6,376,806 | B2 | 4/2002 | Yoo |
| 2002/0001788 | A1 * | 1/2002 | Sakamoto et al. ............ 432/24 |
| 2002/0006677 | A1 | 1/2002 | Egermeier et al. |
| 2002/0022357 | A1 | 2/2002 | Iijima et al. |
| 2003/0077920 | A1 * | 4/2003 | Noda et al. .................. 438/788 |

OTHER PUBLICATIONS

Blessing, J. et al., "Opposing Photoresist in PVD," *European Semiconductor*, 2002, pp. 33–34, vol. 24.
Proost, J. et al., "Critical Role of Degassing of Hot Aluminum Filling," *Journal of Vacuum Sci. and Tech B.*, 1998, pp. 2091–2098, vol. 16, No. 4.

* cited by examiner

*Primary Examiner*—Hsien-Ming Lee
(74) *Attorney, Agent, or Firm*—David G. Dolezal; James L. Clingan, Jr.

(57) ABSTRACT

Heating a reaction chamber or other apparatus in the absence of product wafers to a "curing" temperature above a deposition temperature between the deposition of a film on a first set of semiconductor product wafers and the deposition of a film on a second set of semiconductor product wafers. In some embodiments, a boat with filler wafers is in the reaction chamber when the reaction chamber is heated to the curing temperature. In some examples, the films are deposited by a low pressure chemical vapor deposition (LPCVD) process. With some processes, if the deposition of a film on product wafers is at a temperature below a certain temperature, the film deposited with the product wafer on a boat, filler wafers, and/or other structures in the reaction chamber can cause contamination of product wafers subsequently deposited with a film in the presence of the boat and filler wafers. Contamination from these previously deposited films is inhibited by applying a curing temperature to the deposited fillers in the absence of the product wafers before a film is deposited on the next set of product wafers.

36 Claims, 2 Drawing Sheets

FILM DEPOSITION ON A SEMICONDUCTOR WAFER

BACKGROUND OF THE INVENTION

1. Field of the Invention

This invention relates in general to the manufacture of semiconductor wafers and more specifically to an improved process for the deposition of films on the semiconductor wafers.

2. Description of the Related Art

High temperature low pressure chemical vapor deposition (LPCVD) is utilized for the deposition of films on semiconductor wafers. In one example, silicon nitrides and silicon oxynitrides are deposited on semiconductor wafers by LPCVD to form structures on a semiconductor wafer such as gate spacers and anti-reflective coating (ARC).

With some LPCVD processes, it may become necessary to reduce the deposition temperature in order to minimize dopant diffusion (e.g. in the extension region), dopant de-activation, and/or recrystallization. However, for some film types, depositing an LPCVD film at a lower temperature on a batch of wafers may increase the number of defects in LPCVD films deposited on sequential batches. For example, the deposition of LPCVD silicon nitride on a batch of wafers at 720 C in a furnace may cause defects to occur on an LPCVD silicon nitride film subsequently deposited on another wafer batch in the same furnace.

What is needed in an improved technique for the manufacture of semiconductor wafers.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted.

DETAILED DESCRIPTION

The following sets forth a detailed description of a mode for carrying out the invention. The description is intended to be illustrative of the invention and should not be taken to be limiting.

Figure 1:
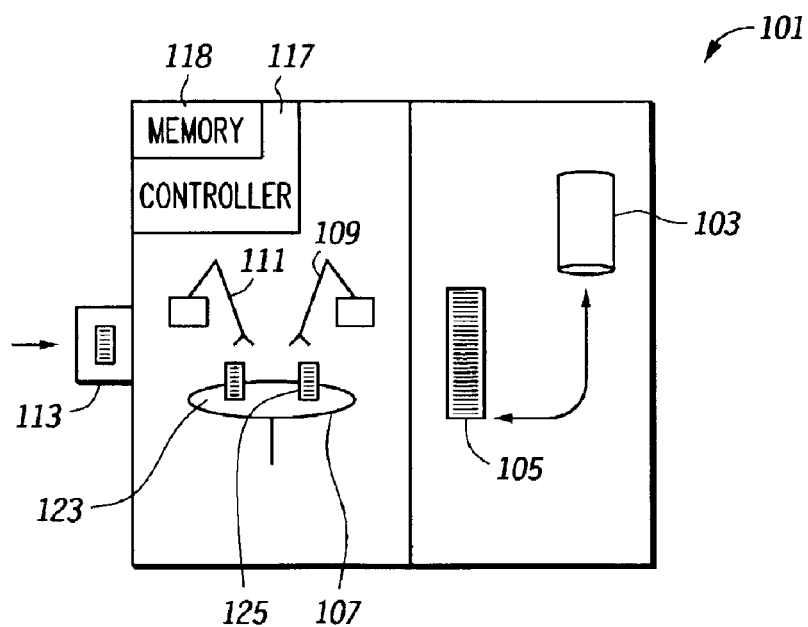
FIG. 1 is a side view of one embodiment of a semiconductor wafer processing tool according to the present invention.

FIG. 1 is a side view of a semiconductor wafer processing tool according to the present invention. Tool 101 can be utilized for depositing LPCVD films on semiconductor wafers (e.g. 221 on FIG. 2). Wafers located in cassettes (e.g. 123 and 125) are loaded into tool 101 at station 113. Robot arm 111 takes the cassettes with the wafers from station 113 and places them on carousel 107. A second robot arm 109 removes the wafers from the cassettes located on carousel 107 and loads them into boat 105. Boat 105 is then inserted into deposition furnace 103 where an LPCVD film is deposited on the wafers. After the deposition of the LPCVD film on the wafers, boat 105 is removed from furnace 103. Robot arm 109 removes the processed wafers from boat 105 and places them in cassettes (e.g. 123 and 125) on carousel 107. Robot arm 111 transfers the cassettes to station 113, wherein the wafers can removed for further processing with other tools (not shown). The operation of tool 101 is controlled by controller 117 which executes code stored in its memory 118 for controlling the operation of the tool 101. In one embodiment, controller 117 controls the temperature in furnace 103, the operation of robot arms 109 and 111, and the movement of boat 105 into and out of furnace 103. In one embodiment, tool 101 is an ADVANCED VERTICAL PROCESS (AVP) sold by ASML.

The LPCVD film deposited in furnace 103 on a product wafer is further processed to form structures of semiconductor devices made from the product wafer. For example, an LPCVD film of silicon nitride or silicon oxynitride is further processed to form gate spacers or anti reflective coatings. In other embodiments, other types of LPCVD films (e.g. polycrystalline silicon, TEOS, Bis(Tertiary-ButylAmino)Silane (BTBAS), or other nitrides) may be deposited on a wafer in furnace 103 and may be utilized to form other types of structures (e.g. spacers, anti reflective coating, dielectrics, or conductive structures) of a semiconductor device.

Figure 2:
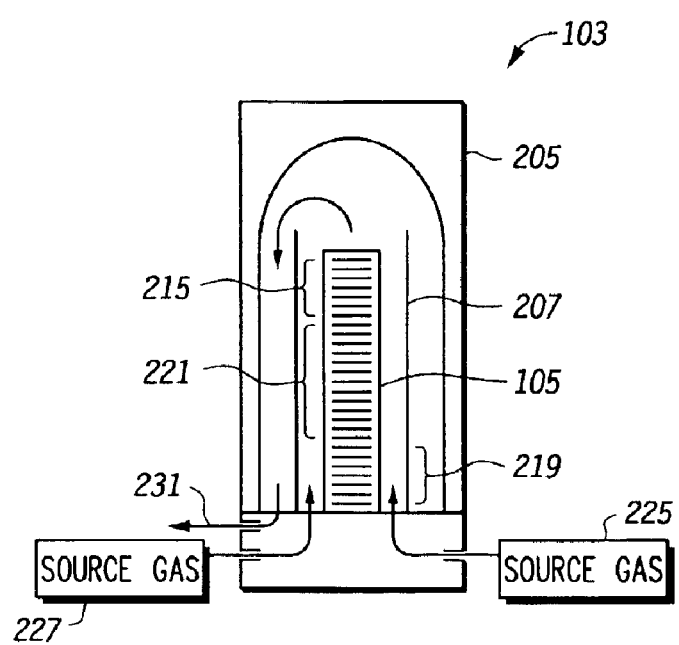
FIG. 2 is a side view of one embodiment of a deposition furnace of a semiconductor wafer processing tool according to the present invention.

FIG. 2 is a side view of furnace 103 shown with boat 105 located therein for the deposition of an LPCVD film on the wafers (e.g. 215, 221, and 219) located in boat 105. Deposition furnace 103 is a reaction chamber configured for the deposition of films on a plurality of wafer surfaces at temperatures above room temperature. Furnace 103 includes a heating element 205 for generating heat to heat the wafers and includes a liner 207 located along the interior side walls of heating element 205. Gas sources 227 and 225 provide reaction gases (e.g. NH3 and DCS) that are injected into furnace 103. Exhaust gases (e.g. byproducts and unreacted gases) are removed from furnace 103 via outlet 231.

Wafers 221 are product wafers. Product wafers are wafers being processed to form semiconductor devices (e.g. memories, microprocessors, or other types of semiconductor circuits). Wafers 215 and 219 are filler wafers. Filler wafers are wafers used in the production of semiconductor devices but from which no semiconductor devices are produced there from. For the example of FIG. 2, filler wafers 215 and 219 are utilized in furnace 103 to provide more uniform deposition rates of film thickness on product wafers 221.

In some embodiments, LPCVD silicon nitride is deposited on a batch of wafers in furnace 103 at a temperature of 720 C. With some of these embodiments, to obtain a deposition temperature of 720 C, the temperature in furnace 103 may vary from 700 C at the bottom of furnace 103 to 740 C at the top of furnace 103 such that the average temperature in furnace 103 is 720 C. In other embodiments, silicon nitride may be deposited at temperatures as low as 350 C. Still with other embodiments, the film maybe deposited at other temperatures (such as e.g. 300–350 C with plasma enhanced CVD) During the deposition process, the LPCVD film is deposited on filler wafers 215 and 219 and product wafers 221. Also during the deposition process, an LPCVD film is deposited on boat 105 and the inner surface of liner 207 as well.

In some embodiments, the deposition of an LPCVD film at temperatures below a particular temperature (e.g. 750 C for silicon nitride) may produce a film that, when subjected to a second process, causes defects in a film applied in the second process. For example, in one embodiment, the deposition of LPCVD silicon nitride on filler wafers 215 and 219, boat 105 and the inner surface of liner 207 in a first LPCVD process in furnace 103, may cause defects in the LPCVD films deposited on other product wafers (not shown but occupying the same location as product wafers 221 in FIG. 2) during subsequent LPCVD processes in furnace 103. For silicon nitride films, these defects are believed to be caused by unreacted silicon sources e.g. dicloro-silane (DCS) or a byproduct (e.g. ammonium chloride) in the LPCVD film deposited at temperatures below 750 C.

In order to reduce the defects due to previously applied LPCVD films on filler wafers 215 and 219, boat 105, and inner surface of liner 207 (as well as other structures in furnace 103), boat 105 (with filler wafers 215 and 219) is reinserted back into furnace 103 after the removal of product wafers 221 from boat 105. Furnace 103 is then heated to a "curing" temperature that is above the temperature that the LPCVD film was deposited. For example, after the deposition of LPCVD silicon nitride film (and after the removal of the product wafers 221 from boat 105) boat 105 with filler wafers 215 and 219 are inserted back into furnace 103 where the furnace is heated to a temperature above 750 C (e.g. 780 C). Heating the furnace to a curing temperature with boat 105 and filler wafers 215 and 219 therein inhibits the formation of defects caused by previously deposited films. This inhibition in the formation of defects is believed to be caused the by out gassing of byproducts and the reaction of silicon sources in the previously applied films at the curing temperature.

Figure 3:
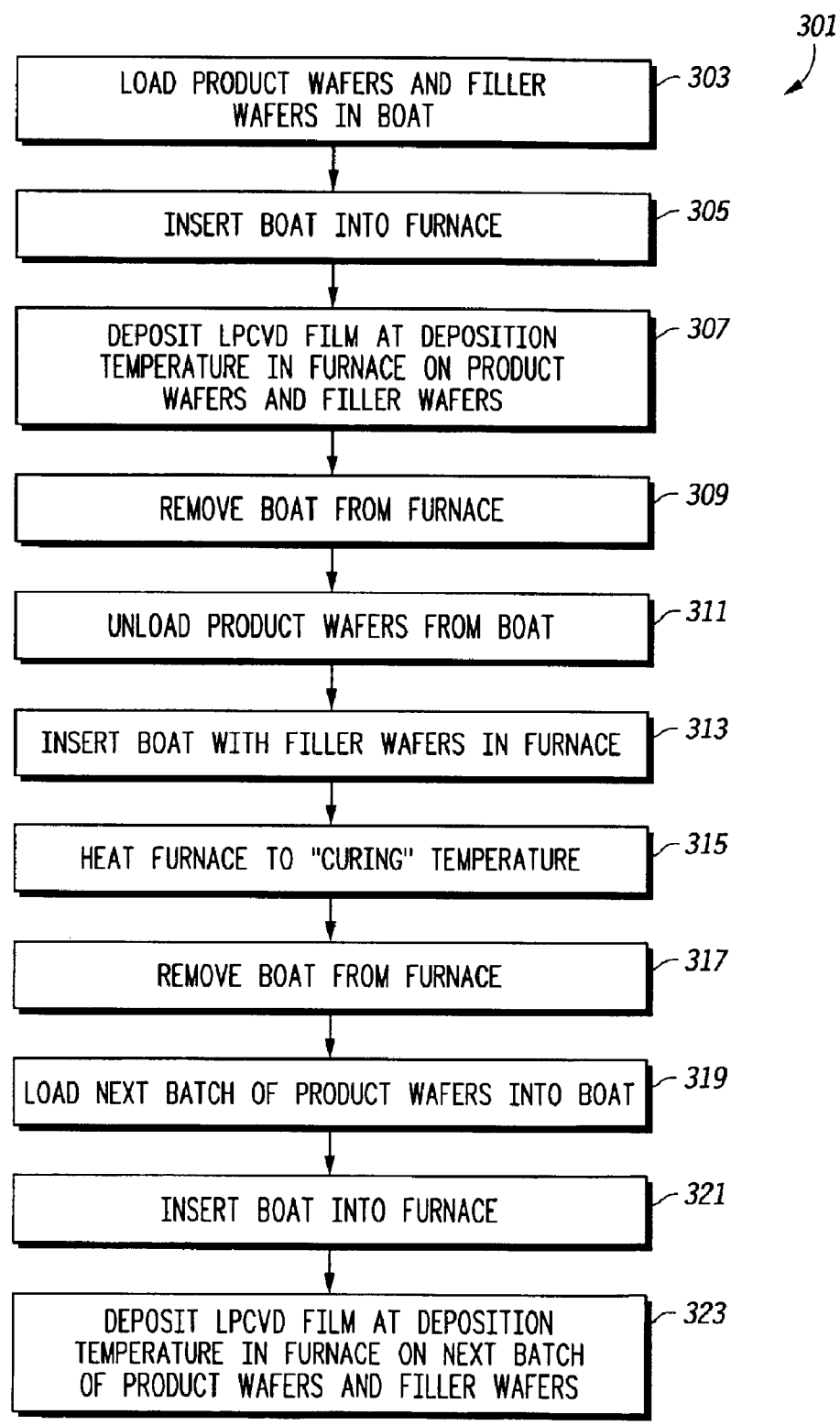
FIG. 3 is a flow diagram of one embodiment of a portion of a process for manufacturing semiconductor wafers according to the present invention.

FIG. 3 shows one embodiment of a portion of a process 301 for manufacturing a semiconductor wafer according to the present invention. In 303, product wafers (e.g. 221) and filler wafers (e.g. 215 and 219) are loaded into boat 105 by robot arm 109 (see FIG. 1). In 305, boat 105 (with the product wafers and filler wafers) is inserted into furnace 305 under the control of controller 117. In 307, an LPCVD film is deposited at a deposition temperature (e.g. 720 C for silicon nitride) on the product wafers, filler wafers, as well as boat 105 and the inner surface of liner 207. In 309, boat 105 (with the product wafers and filler wafers) is removed from furnace 103. In 311, the product wafers are removed from boat 105. In 313, the boat (with the filler wafers) is reinserted into furnace 103.

In 315, furnace 103 is heated to a "curing" temperature sufficient to reduce the formation of defects in subsequently applied LPCVD films due to the previously applied LPCVD film on the filler wafers, boat 105, inner surface of liner 207, and other structures of furnace 103. This curing temperature is above the deposition temperature. For silicon nitride, this curing temperature is greater than 750 C (e.g. 780 C). In some embodiments, the curing temperature is dependent upon the type of film being deposited. In one embodiment, furnace 103 is heated until the furnace reaches the curing temperature. Afterwards, the temperature of furnace 103 is allowed to cool down to a standby temperature (e.g. 500–650 C for silicon nitride).

In 317, boat 105 (with the filler wafers) is removed from furnace 103. In 319, the next batch of product wafers is inserted into boat 105 by robot arm 109. In 321, boat 105 (with the filler wafers and the next batch of product wafers) is inserted into furnace 103 where in 323, an LPCVD film is deposited at a deposition temperature in furnace 103 on the next batch of product wafers, filler wafers, boat 105, inner surface of liner 207, and other structures of furnace 103. In subsequent processing operations, the second batch of product wafers would be removed wherein boat 105 with the filler wafers would be reinserted into furnace 103 for heating to the curing temperature to reduce defects in subsequently deposited films in furnace 103. Other conventional processing operations would then be performed on the product wafers to produce semiconductor devices.

In some embodiments, the film deposited in 307 may be of a different type than the film deposited in 323. In other embodiments, the deposition temperature, deposition pressure, or reaction gasses utilized in 307 may be different than the deposition temperature, deposition pressure, or reaction gasses utilized in 323. With some embodiments, the operations shown in FIG. 3 would be controlled by controller 117 executing a program stored in memory 118. In one embodiment, code stored in memory 118 would, when executed, automatically direct controller 117 to perform operations 313, 315, and 317 after operation 311. Also in other embodiments, the filler wafers would be unloaded from boat 105 with the product wafers in 311, wherein the filler wafers would be reloaded back into boat before 313.

Those of skill in the art will recognize that, based upon the teachings herein, several modifications may be made to the embodiments shown in FIGS. 1–3 and described herein. For example, the utilization of curing temperatures as shown or described herein may be implemented with the deposition of other types of films such as e.g. silicon oxide, metal depositions, metal oxide, metal nitride, metal oxynitride, metal silicon oxynitride, or metal silicates. Also, the utilization of curing temperatures as described herein may also be implemented with other deposition techniques such as e.g. Atomic Layer Deposition (ALD), atmospheric deposition processes, plasma enhanced CVD (PECVD), metal organic CVD (MOCVD), or sputtering (physical vapor deposition). Furthermore, the implementation of curing temperatures can be utilized with other types of reaction chambers such as, e.g., with single wafer deposition chambers. With single wafer deposition chambers, filler wafers may not be required. Also with other embodiments, a hot plate or other heating device may be utilized to heat the filler wafers and/or boat prior to subsequent depositions of films in a furnace.

In one aspect, the present invention includes a method of depositing a film on product wafers. The method includes loading a boat with a plurality of filler wafers and a first plurality of product wafers and inserting the boat with the plurality of filler wafers and the first plurality of product wafers into a furnace. The method also includes depositing a film by low pressure chemical vapor deposition in the furnace at a temperature below a first temperature on the first plurality of product wafers, the boat, and the plurality of filler wafers. The method further includes removing the boat with the plurality of filler wafers and the first plurality of product wafers from the furnace, unloading the first plurality of product wafers from the boat, and after unloading the first plurality of product wafers, inserting the boat with the plurality of filler wafers into the furnace. The method further includes, after inserting the boat with the filler wafers into the furnace, heating the furnace to a temperature greater than the first temperature. The method still further includes removing the boat from the furnace, loading a second plurality of product wafers into the boat, and inserting the boat with the second plurality of product wafers and the plurality of filler wafers into the furnace. The method includes depositing a film by low pressure chemical vapor deposition in the furnace on the second plurality of product wafers, the boat, and the plurality of filler wafers.

In another aspect, the present invention includes a method of deposition using a reaction chamber. The method includes depositing a first film at a first temperature below a second temperature on a first wafer in the reaction chamber and removing the first wafer from the reaction chamber. The method includes, after removing the first wafer, heating the reaction chamber to at least the second temperature and, after heating the reaction chamber to at least the second temperature, inserting a second wafer in the reaction chamber and depositing a second film at a third temperature below the second temperature on the second wafer in the reaction chamber.

In another aspect, the present invention includes a method for depositing a film using a reaction chamber. The method includes depositing a first film of a first type on a first plurality of product semiconductor wafers in the reaction chamber at a temperature below a first temperature and depositing a second film of the first type on a second plurality of product semiconductor wafers in the reaction chamber at a temperature below the first temperature. The method also includes, after depositing the first film and before depositing the second film, heating the reaction chamber to at least the first temperature wherein the reaction chamber is empty of the first plurality of product semiconductor wafers and the second plurality of product semiconductor wafers during the heating of the reaction chamber to at least the first temperature.

In another aspect of the present invention, in a manufacturing method of depositing the same film type with consecutive depositions on a first set and then a second set of semiconductor wafers, wherein the depositing results in the same film type being deposited on an apparatus during both depositions, the method includes heating the apparatus in the absence of the first and second sets of semiconductor wafers at a time between the consecutive depositions to inhibit the apparatus from contaminating the second set of semiconductor wafers during the deposition of the same film type on the second set of semiconductor wafers.

In another aspect of the present invention, an apparatus for depositing films on semiconductor wafers includes a reaction chamber for depositing films on semiconductor wafers. The apparatus also includes a boat and a controller. The controller controls the movement of the boat into and out of the reaction chamber and the temperature of the reaction chamber. The controller further includes a memory storing code whose execution directs the controller to insert the boat with filler wafers in the reaction chamber, heat the reaction chamber to at least a first temperature, and remove the boat with the filler wafers after the boat with the filler wafers and product wafers have been previously removed from the reaction chamber in which a first film was deposited on the filler wafers and the product wafers and after the product wafers have been removed from, the boat after the removal of the boat from the reaction chamber.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A method of depositing a film on product wafers, comprising:

loading a boat with a plurality of filler wafers and a first plurality of product wafers;

inserting the boat with the plurality of filler wafers and the first plurality of product wafers into a furnace;

depositing a film by low pressure chemical vapor deposition in the furnace at a temperature below a first temperature on the first plurality of product wafers, the boat, and the plurality of filler wafers;

removing the boat with the plurality of filler wafers and the first plurality of product wafers from the furnace;

unloading the first plurality of product wafers from the boat;

after unloading the first plurality of product wafers, inserting the boat with the plurality of filler wafers into the furnace;

after inserting the boat with the plurality of filler wafers into the furnace, heating the furnace to a temperature greater than the first temperature;

removing the boat from the furnace;

loading a second plurality of product wafers into the boat;

inserting the boat with the second plurality of product wafers and the plurality of filler wafers into the furnace; and depositing a film by low pressure chemical vapor deposition in the furnace on the second plurality of product wafers, the boat, and the plurality of filler wafers.

2. The method of claim 1, wherein the first temperature is 750 degrees Celsius.

3. The method of claim 1 wherein the film is silicon nitride.

4. The method of claim 3, wherein the first temperature is about 780 degrees Celsius.

5. The method of claim 1, wherein the film is one of silicon nitride, silicon oxynitride, a metal nitride, a metal silicon oxynitride, metal oxide, and silicon oxide.

6. The method of claim 1 wherein:

the depositing a film by low pressure chemical vapor deposition in the furnace at a temperature below a first temperature further includes depositing the film by low pressure chemical vapor deposition in the furnace at a temperature at least 30° C. below the first temperature.

7. A method of deposition using a reaction chamber, comprising:

depositing a first film at a first temperature below a second temperature on a first wafer in the reaction chamber;

removing the first wafer form the reaction chamber;

after removing the first wafer heating the reaction chamber to at least the second temperature; and after heating the reaction chamber to at least the second temperature, inserting a second wafer in the reaction chamber and depositing a second film at a third temperature below the second temperature on the second wafer in the reaction chamber.

8. The method of claim 7, wherein the first film and the second film are of the same type and the first temperature and the third temperature are the same.

9. The method of claim 8, wherein the same type is silicon nitride and the second temperature is 750 degrees Celsius.

10. The method of claim 7, wherein the second temperature is about 780 degrees Celsius.

11. The method of claim 7, wherein the reaction chamber is a furnace.

12. The method of claim 7, wherein the first temperature and the third temperature are about 720 degrees Celsius.

13. The method of claim 7, further comprising:

depositing the first film on a plurality of filler wafers while depositing the first film on the first wafer; and heating the plurality of filler wafers in the reaction chamber while heating the reaction chamber to at least the second temperature.

14. The method of claim 13, further comprising:
depositing the second film on the plurality of filler wafers in the reaction chamber while depositing the second film on the second wafer.

15. The method of claim 14, further comprising providing a boat, wherein:
the first wafer and the plurality of filler wafers are loaded in the boat prior to being deposited with the first film;
the plurality of filler wafers are in the boat while being heated in the reaction chamber; and
the second wafer is loaded in the boat prior to being deposited with the second film.

16. The method of claim 7, wherein the first film and the second film are one of silicon oxynitride, a metal nitride, a metal silicon oxynitride, metal oxide, metal, metal oxynitride, metal silicate, and silicon oxide.

17. The method of claim 7, wherein the first film and the second film are silicon nitride.

18. The method of claim 7 wherein the first temperature and the third temperature are at least 30° C. below the second temperature.

19. A method for depositing a film using a reaction chamber, comprising:
depositing a first film of a first type on a first plurality of product semiconductor wafers in the reaction chamber at a temperature below a first temperature;
depositing a second film of the first type on a second plurality of product semiconductor wafers in the reaction chamber at a temperature below the first temperature; and
after depositing the first film and before depositing the second film, heating the reaction chamber to at least the first temperature wherein the reaction chamber is empty of the first plurality of product semiconductor wafers and the second plurality of product semiconductor wafers during the heating of the reaction chamber to at least the first temperature.

20. The method of claim 19, wherein the first type is silicon nitride.

21. The method of claim 20, wherein the first temperature is 750 degrees Celsius.

22. The method of claim 20, wherein the first temperature is about 780 degrees Celsius.

23. The method of claim 19, wherein the first temperature is sufficient to inhibit contamination of the second plurality of product semiconductor wafers.

24. The method of claim 19, wherein the reaction chamber has a liner with an inner surface, wherein depositing the first film includes depositing the first film on the inner surface and wherein depositing the second film includes depositing the second film on the inner surface.

25. The method of claim 19, wherein the first plurality of product semiconductor wafers and the second plurality of product semiconductor wafers are in a boat during the depositing of the first and second film, respectively, and wherein the boat, empty of the first plurality and second plurality of product wafers, is in the reaction chamber during the heating of the reaction chamber to at least the first temperature.

26. The method of claim 19, wherein the first type is one of silicon nitride, silicon oxynitride, a metal nitride, a metal silicon oxynitride, metal oxide, metal, metal oxynitride, metal silicate, and silicon oxide.

27. The method of claim 19, wherein the first type is silicon nitride.

28. The method of claim 19 wherein the first film and the second film are each deposited at temperatures at least 30° C. below the first temperature.

29. In a manufacturing method of depositing a same film type with consecutive depositions on a first set and then a second set of semiconductor wafers, wherein the depositing results in the same film type being deposited on an apparatus during both depositions, a method comprising:
heating the apparatus in the absence of the first and second sets of semiconductor wafers at a time between the consecutive depositions to inhibit the apparatus from contaminating the second set of semiconductor wafers during the deposition of the same film type on the second set of semiconductor wafers, wherein the heating includes heating the apparatus at a temperature greater than a temperature at which the same film type is deposited on the first set of wafers and at which the same film type is deposited on the second set of wafers.

30. The method of claim 29, wherein the apparatus is an inner surface of a liner of a reaction chamber.

31. The method of claim 29, wherein the apparatus is a boat for holding the first and second set of semiconductor wafers.

32. The method of claim 29, wherein the apparatus is a plurality of filler wafers.

33. The method of claim 29, wherein the same type is one of silicon nitride, silicon oxynitride, a metal nitride, a metal silicon oxynitride, metal oxide, metal, metal oxynitride, metal silicate, and silicon oxide.

34. The method of claim 29, wherein the same type is silicon nitride.

35. The method of claim 29 wherein the heating includes heating the apparatus at a temperature at least 30° C. greater than at which the same film type is deposited on the first set of wafers and at which the same film type is deposited on the second set of wafers.

36. The method of claim 29 wherein the temperature greater than a temperature at which the same film type is deposited on the first set of wafers and at which the same film type is deposited on the second set of wafers is at least 750° C.

* * * * *

UNITED STATES PATENT AND TRADEMARK OFFICE
CERTIFICATE OF CORRECTION

PATENT NO. : 6,881,681 B2  
APPLICATION NO. : 10/301993  
DATED : April 19, 2005  
INVENTOR(S) : Olubumni O. Adetutu et al.

Page 1 of 1

It is certified that error appears in the above-identified patent and that said Letters Patent is hereby corrected as shown below:

Column 6, Line 42:

Change "form" to --from--

Column 6, Line 43:

Add --,-- after "wafer"

Signed and Sealed this

Twenty-second Day of May, 2007

JON W. DUDAS  
*Director of the United States Patent and Trademark Office*